(12) United States Patent
Nielsen

(10) Patent No.: US 9,559,647 B2
(45) Date of Patent: Jan. 31, 2017

(54) AMPLIFIER CIRCUIT

(75) Inventor: Ivan Riis Nielsen, Stenløse (DK)

(73) Assignee: EPCOS AG, Munich (DE)

( * ) Notice: Subject to any disclaimer, the term of this patent is extended or adjusted under 35 U.S.C. 154(b) by 85 days.

(21) Appl. No.: 14/402,681

(22) PCT Filed: May 21, 2012

(86) PCT No.: PCT/EP2012/059379
§ 371 (c)(1),
(2), (4) Date: Feb. 18, 2015

(87) PCT Pub. No.: WO2013/174412
PCT Pub. Date: Nov. 28, 2013

(65) Prior Publication Data
US 2015/0162883 A1     Jun. 11, 2015

(51) Int. Cl.
H03F 1/36    (2006.01)
H03F 3/45    (2006.01)
H03F 1/26    (2006.01)
H03F 3/181   (2006.01)
H03F 1/02    (2006.01)
(Continued)

(52) U.S. Cl.
CPC ........ H03F 3/45475 (2013.01); H03F 1/0272 (2013.01); H03F 1/26 (2013.01); H03F 1/56 (2013.01); H03F 3/181 (2013.01); H03F 3/211 (2013.01); H03F 3/45273 (2013.01); H04R 3/00 (2013.01); H03F 2200/135 (2013.01); H03F 2200/387 (2013.01); H03F 2200/48 (2013.01); H03F 2203/45166 (2013.01); H03F 2203/45288 (2013.01); H04R 19/04 (2013.01)

(58) Field of Classification Search
CPC . H03F 1/34; H03F 2200/126; H03F 2200/129
USPC ................................... 330/85, 174; 381/121
See application file for complete search history.

(56) References Cited

U.S. PATENT DOCUMENTS 4,562,406 A * 12/1985 Baker ..................... H03F 3/347
                                                        330/149
6,580,317 B1    6/2003 Oppelt
(Continued)

FOREIGN PATENT DOCUMENTS

EP    0531163 A1    3/1993
EP    0880225 A2    11/1998
(Continued)

OTHER PUBLICATIONS

Silva-Martinez, Jose et al., "Low Frequency Amplifiers for Electret Microphones", Circuits and Systems, 1995 Proceedings of the 38th Mid West Symposium, Brazil Aug. 13-16, 1995, vol. 2, pp. 1018-1021.

*Primary Examiner* — Steven J Mottola
(74) *Attorney, Agent, or Firm* — McDermott Will & Emery LLP

(57) ABSTRACT

The present disclosure relates to an amplifier circuit (2) for a capacitive transducer (1), comprising a preamplifier (8) adapted to receive a transducer signal through an input node (9) and to provide an amplified signal at an output node (10), and a transconductance amplifier (11) comprising a first input (12) and an output (14), wherein the first input (12) of the transconductance amplifier (11) is connected to the output node (10), and the output (14) of the transconductance amplifier (11) is connected to the input node (9).

8 Claims, 2 Drawing Sheets

(51) Int. Cl.
*H03F 1/56* (2006.01)
*H04R 3/00* (2006.01)
*H03F 3/21* (2006.01)
*H04R 19/04* (2006.01)

(56) References Cited

U.S. PATENT DOCUMENTS

| | | |
|---|---|---|
| 2003/0234684 A1 | 12/2003 | Oppelt |
| 2004/0189149 A1 | 9/2004 | Micko |
| 2005/0151589 A1 | 7/2005 | Fallesen |
| 2006/0273805 A1 | 12/2006 | Peng et al. |
| 2007/0018318 A1 | 1/2007 | Marsh et al. |
| 2007/0109064 A1 | 5/2007 | Micko |
| 2009/0285414 A1 | 11/2009 | Wu |
| 2011/0026739 A1 | 2/2011 | Thomsen et al. |
| 2013/0266156 A1* | 10/2013 | Frohlich .................. H03F 1/34 381/120 |

FOREIGN PATENT DOCUMENTS

| | | |
|---|---|---|
| EP | 1355417 A1 | 10/2003 |
| EP | 1553696 A1 | 7/2005 |
| JP | S5853246 U | 4/1983 |
| JP | H0567928 A | 3/1993 |
| JP | 2004527169 A | 9/2004 |
| JP | 2009153047 A | 7/2009 |
| WO | WO-02078177 A1 | 10/2002 |
| WO | 2006/130828 A2 | 12/2006 |

* cited by examiner

AMPLIFIER CIRCUIT

The present disclosure relates to an amplifier circuit. In particular, the present disclosure relates to an amplifier circuit for a capacitive transducer element as used in miniature condenser microphones.

An amplifier circuit is known from EP 1 553 696 B1 comprising a main amplifier and a feedback amplifier. However, this circuit suffers from significant temperature dependence of its AC characteristic.

It is one object of the present disclosure to provide an improved amplifier circuit, e.g. an amplifier circuit having an improved way to control the DC bias point of the circuit.

This object is, inter alia, achieved by the subject of the independent claim. Advantageous embodiments and refinements are the subject-matter of the dependent claims. However, further advantageous concepts may be disclosed herein besides the ones which are claimed.

One aspect relates to an amplifier circuit for a capacitive transducer. The amplifier circuit comprises a preamplifier adapted to receive a transducer signal through an input node and to provide an amplified signal at an output node, and a transconductance amplifier comprising a first input and an output. Further, the first input of the transconductance amplifier is connected to the output node, and the output of the transconductance amplifier is connected to the input node.

Accordingly, the amplifier circuit comprises a feedback loop wherein the transconductance amplifier is arranged in said feedback loop. Thereby, a high pass function is created.

The transconductance amplifier is configured such that it sets or forces the DC bias point of the preamplifier. Further, the feedback loop makes the preamplifier insensitive to parasitic leakage currents flowing into, or out from, the input node of the preamplifier as the feedback loop automatically equals out any leakage current and thereby provides a valid DC bias point of the amplifier circuit.

In one embodiment, the transconductance amplifier may be a class AB amplifier. This is an advantage because the output noise power of the transconductance amplifier tends to be proportional to the bias current. In contrast to a class A amplifier, a class AB amplifier is biased at a lower current than the required maximum output current, thereby minimizing the output noise power.

In one embodiment, the transconductance amplifier further comprises a second input connected to a reference voltage source and the transconductance amplifier is configured to provide a signal at the output that corresponds to the difference between the signals applied to its first and its second input.

Accordingly, the current provided at the output of the transconductance amplifier corresponds to the deviation of the voltage provided at the output node of the preamplifier from the voltage provided by the reference voltage source.

In one embodiment, a current mirror circuit is inserted between the output of the transconductance amplifier and the preamplifier input. A current mirror circuit is a circuit designed to copy a current through one active device by controlling the current in another active device of a circuit, keeping the output current constant regardless of loading.

The current mirror circuit may be adapted to downscale an output current provided by the output of the transconductance amplifier.

Additionally or alternatively to the current mirror circuit, a capacitive attenuator circuit may be connected between the output of the transconductance amplifier and the preamplifier input. The capacitive attenuator may increase the required transconductance value to a more practical value.

In one embodiment, the capacitive attenuator circuit comprises a first capacitance connected in series between the output of the transconductance amplifier and the preamplifier input and a pair of anti-parallel diodes connected in parallel to the first capacitance. The anti-parallel diodes are cross-coupled. The diodes may be semiconductor PN junction diodes. Alternatively, they can be replaced by some other circuitry which provides a DC path in case of large voltage excursions at the transconductance amplifier output.

In one embodiment, the AC impedance of the anti-parallel diodes is higher than the AC impedance of the first capacitance. However, the anti-parallel diodes may provide a DC path.

In one embodiment, the capacitive attenuator circuit comprises a second capacitance connected in series between a reference terminal and a node arranged in a path connecting the output of the transconductance amplifier and the first capacitance such that the second capacitance is in a path which is parallel to the path comprising the first capacitance. The second capacitance may have a larger capacitance than the first capacitance.

A preferred embodiment of the invention will be described in the following with reference to the accompanying drawings, wherein.

Figure 1:
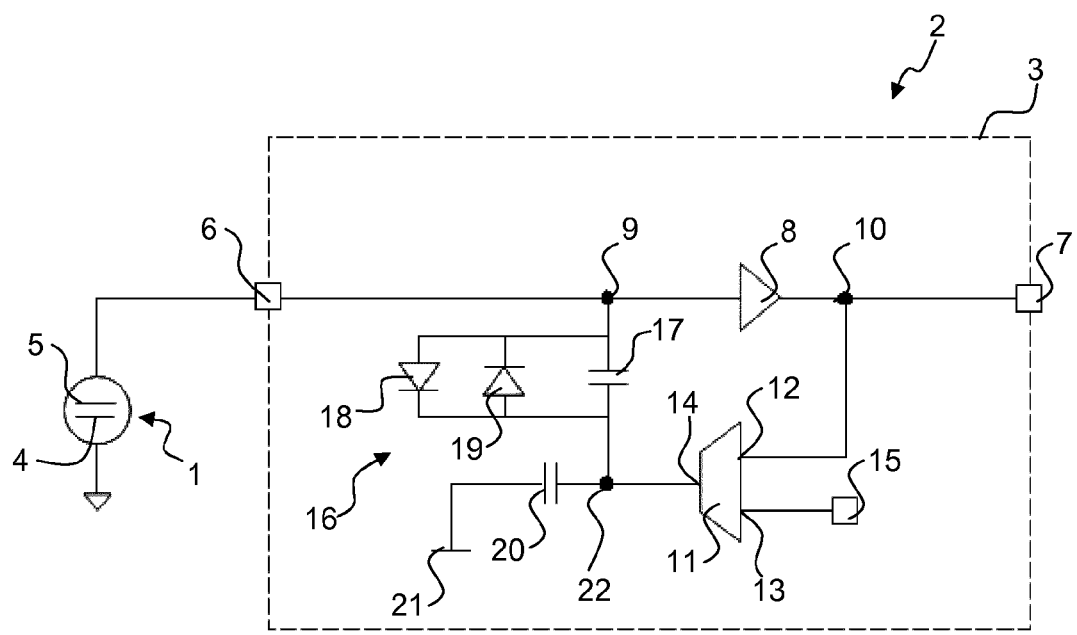
FIG. 1 shows a block diagram of an amplifier circuit.

FIG. 1 shows a condenser transducer element 1 of a miniature microphone coupled to an amplifier circuit 2 integrated on a monolithic integrated die 3. The transducer element 1 comprises a diaphragm 4 and a back plate 5 wherein the diaphragm 4 is movable relative to the back plate 5. A bias voltage may be applied between diaphragm 4 and back plate 5.

The integrated die 3 comprises an input terminal 6 and an output terminal 7. The condenser transducer element 1 is connected to the input terminal 6 of the integrated die 3.

The amplifier circuit 2 comprises a preamplifier 8 comprising an input node 9 and an output node 10. The input node 9 of the preamplifier 8 is connected to the input terminal 6 of the die 3. Accordingly, a signal that is outputted by the transducer element 1 is transferred to the input node 9 of the preamplifier 8. The preamplifier 8 is further configured to amplify said signal and to provide an amplified signal at its output node 10.

The preamplifier 8 may be an inverting amplifier. Accordingly, the preamplifier 8 inverts and simultaneously scales the input signal. Alternatively, the preamplifier 8 may be a non-inverting amplifier, in which case the transconductance amplifier must be inverting.

Further, the output node 10 of the preamplifier 8 is connected to the output terminal 7 of the monolithic die 3.

Further, the amplifier circuit 2 comprises a transconductance amplifier 11. The transconductance amplifier comprises a first input 12, a second input 13 and an output 14. The first input 12 of the transconductance amplifier 11 is connected to the output node 10 of the preamplifier 8. The second input 13 of the transconductance amplifier 11 is connected to a reference voltage source 15. The reference voltage source 15 provides a constant voltage. Further, the transconductance amplifier 11 is configured to provide a signal at its output 14 that corresponds to the difference between the signals applied to its first and its second input 12, 13.

Moreover, the amplifier circuit 2 may comprise a current mirror circuit 2 which may be connected in series with the transconductance amplifier 11 and which is not shown in FIG. 1.

The combination of the current mirror circuit 23 and the transconductance amplifier 11 forms a class AB transconductance amplifier. In particular, the class AB transconductance amplifier is realized by using a class A transconductance amplifier 11 with a transconductance Gm1=Gm*M and inserting the current mirror circuit 23. As will be discussed later on, the current mirror circuit 23 provides a down-scaling of a signal provided by the transconductance amplifier 11 by a factor M at the output of the transconductance amplifier 11. In particular, the class AB operation may be realized by the current mirror circuit 23. Combining the class A transconductance amplifier 11 with transconductance Gm1 and the down-scaling class AB current mirror circuit 23 provides a new class AB transconductance amplifier with transconductance Gm. This combined amplifier may be provided in the amplifier circuit 2 in the place of transconductance amplifier 11.

The transconductance amplifier 11 is arranged in a feedback loop. The output 14 of the transconductance amplifier 11 is connected to the input node 9 of the preamplifier 8. The feedback loop allows to control and to set the operating point of the preamplifier 8.

However, it is desirable to reduce the noise provided by the transconductance amplifier 11 in the feedback loop. The noise current is roughly given by $S_{noise}=4 \cdot k_B \cdot T \cdot G$ wherein $k_B$ is the Boltzmann constant, T is the temperature and G is the transconductance of transconductance amplifier 11. Accordingly, the noise current power spectral density is proportional to the transconductance of the transconductance amplifier 11.

In particular at low frequencies, the noise becomes high compared to the signal. For this purpose, a capacitive attenuator 16 is integrated between the output 14 of the transconductance amplifier 11 and the input node 9 of the preamplifier 8.

In the embodiment shown in FIG. 1, the capacitive attenuator 16 comprises a first capacitance 17 connected in series between the output 14 of the transconductance amplifier 11 and the input node 9 of the preamplifier 8. Further, the capacitive attenuator 16 comprises a pair of anti-parallel diodes 18, 19 connected in parallel to the first capacitance 17. The anti-parallel diodes 18, 19 are cross-coupled. The diodes 18, 19 may be semiconductor PN junction diodes. Alternatively, they can be replaced by some other circuitry which provides a DC path in case of large voltage excursions at the transconductance amplifier output.

Moreover, the capacitive attenuator 16 comprises a second capacitance 20 connected in series between a reference terminal 21 and a node 22 arranged in a path connecting the output 14 of the transconductance amplifier 11 and the first capacitance 17. The reference terminal 21 may be ground. Accordingly, the path comprising the second capacitance 20 is connected in parallel to the path comprising the first capacitance 17. The path comprising the second capacitance 20 draws current away from the path comprising the first capacitance 17.

The first capacitance 17 is chosen such that its capacitance is smaller than the sum of the capacitance between the back plate 5 and the diaphragm 4 of the transducer element 1 and the input capacitance of the preamplifier 8. Further, the second capacitance 20 may have a larger capacitance than the first capacitance 17. For example, the second capacitance 20 may be 200 times the first capacitance 17. In this case, the capacitive attenuator 16 reduces the signal by 46 dB.

When the first capacitance 17 having a capacitance of C1 is much smaller than the sum of the capacitance between the back plate 5 and the diaphragm 4 of the transducer element 1 and the input capacitance of the preamplifier 8, then the capacitance seen into C1 is approximately equal to Cser=~C1. The current flowing into Cser from the transconductance amplifier 11 is also the output current of the capacitive attenuator. The input current of the capacitive attenuator includes also the current flowing through the second capacitor 20 having a capacitance of Cpar=C2. This means that the current transfer ratio is equal to Cser/(Cser+Cpar)–C1/(C1+C2). With C2 being much smaller than C1, e.g. by a factor of 200, the attenuation is ~20*log 10(C2/C1)=20*log 10(200)=46 dB.

To get the same dynamic behavior, the transconductance of the transconductance amplifier 11 is increased by a factor that corresponds to the ratio of the first and the second capacitance, e.g. by a factor of 200. As the noise $S_{noise}$ is proportional to the transconductance, the noise power is also increased by this factor. Accordingly, the noise current at the transconductance amplifier 11 will be 23 dB higher. However, due to the attenuation of the capacitive attenuator 16, it will be 23 dB lower at the preamplifier 8.

Further, the AC impedance of the anti-parallel diodes 18, 19 is higher than the AC impedance of the first capacitance 17. However, DC current is enabled to pass through the anti-parallel diodes 18, 19. Accordingly, they provide a DC path.

In general, the capacitive attenuator 16 down-scales the output signal of the transconductance amplifier 11. Thereby, the noise is attenuated to a greater extent than the signal by the capacitive attenuator 16.

The present invention is not restricted to capacitive attenuators 16 comprising anti-parallel diodes 18, 19. A capacitive attenuator 16 may also comprise a circuit comprising transistors, e.g. a PMOS and a NMOS.

Figure 2:
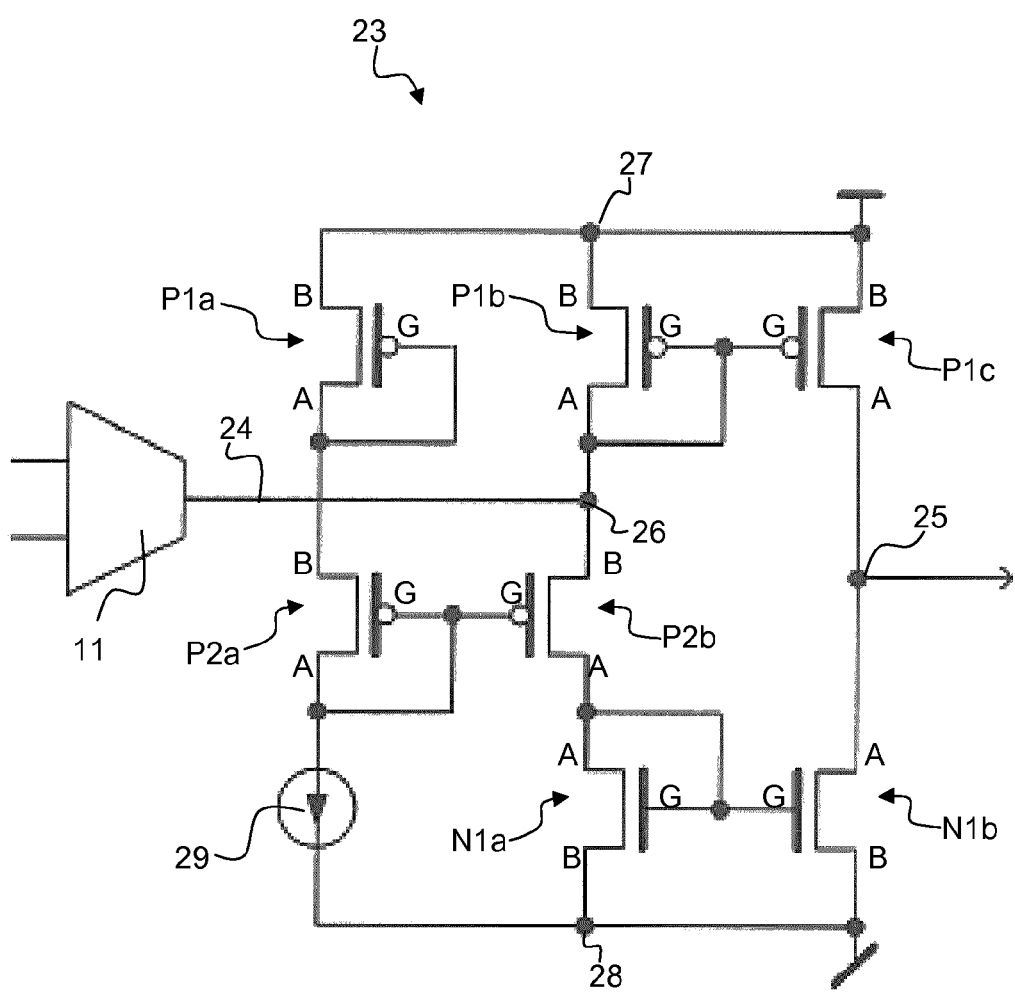
FIG. 2 shows a current mirror circuit.

Additionally or alternatively to the capacitive attenuator 16, a class AB current mirror circuit 23 may be inserted between the output 14 of the transconductance amplifier 11 and the input node 9 of the preamplifier 8. FIG. 2 shows a circuit diagram of the current mirror circuit 23. The current mirror circuit 23 is configured to down-scale a signal provided by the output 14 of the transconductance amplifier 11. The down-scaled signal is inputted into the input node 9 of the preamplifier 8. If a capacitive attenuator is also employed, the down-scaled current is inputted into the input 22 of the capacitive attenuator.

The current mirror circuit 23 comprises transistors. In particular, the current mirror circuit 23 comprises seven transistors. The current mirror circuit 23 comprises five PMOS transistors P1a, P1b, P2a, P2b, P1c and two NMOS transistors N1a, N1b. Each of the NMOS and PMOS transistors comprises a gate G and a source-to-drain channel having a first port A and a second port B. The first port A may be the drain and the second port B may be the source of the respective transistor, or vice versa.

Furthermore, the current mirror circuit 23 comprises a bias current generator 29 which is configured to provide a constant bias current IB.

Further, an input port 24 of the current mirror circuit 23 is connected to the output 14 of the transconductance amplifier 11. The input port 24 is electrically connected to a first node 26 that is connected to the gates of PMOS transistors P1b, P1c. Further, the first node 26 is connected to the first port A of the source-to-drain channel of the PMOS transistor P1b. Further, the first node 26 is connected to a second port B of the source-to-drain channel of the PMOS transistor P2b.

The second port B of the source-to-drain channel of the PMOS transistor P1b is connected to a second node 27. The second node 27 is connected to the second port B of the source-to-drain channel of the PMOS transistor P1c. Further, the first port A of the source-to-drain channel of the PMOS transistor P1c is connected to an output port 25 of the current mirror circuit 23.

Further, the second node 27 is connected to the second port B of source-to-drain channel of the PMOS transistor P1a wherein the first port A of the PMOS transistor P1a is further connected to the gate G of the PMOS transistor P1a. Moreover, the first port A of the PMOS transistor P1a is connected to the second port B of source-to-drain channel of the PMOS transistor P2a. Further, the first port A of the PMOS transistor P2a is connected to the gates G of each of the PMOS transistors P2a and P2b. Further, the first port A of the PMOS transistor P2a is connected to the bias current generator 29 which is configured to provide a constant bias current IB.

Moreover, the first port A of the PMOS transistor P2a is connected to a third node 28. The third node 28 is connected to the second port B of source-to-drain channel of the NMOS transistor N1a. Moreover, the first port A of the NMOS transistor N1a is connected to the first port A of source-to-drain channel of the PMOS transistor P2b. Further, the first port A of the NMOS transistor N1a is connected to the gates G of each of the NMOS transistors N1a and N1b. Moreover, the third node 28 is connected to the second port B of the source-to-drain channel of the NMOS transistor N1b. The first port A of source-to-drain channel of the NMOS transistor N1b is connected to the output port 25 of the current mirror circuit 23.

In the following, the mode of operation of the current mirror circuit 23 is discussed:

Let us first consider the quiescent situation where zero input current is flowing from the transconductance amplifier at the input port 24. In this case, the biasing current IB is flowing through transistors P1a and P2a. When transistors P1a and P1b have been designed with the same width to length ratio and transistors P2a and P2b have been designed with the same width to length ratio, this means that the current flowing through transistors P1b, P2b and N1a will also be equal to IB. When transistor P1c has been designed with a width to length ratio M times lower than that of transistor P1b, and transistor N1b has been designed with a width to length ratio M times lower than that of transistor N1a, it means that a current of IB/M will be flowing through both transistors N1b and P1c. Therefore, zero current will be flowing out of the current mirror at 25.

Next, let us consider the situation where a small current is flowing into the current mirror input at 24. This will result in a slightly larger current flowing through transistors P2b, N1a and N1b and a slightly lower current flowing through transistors P1b and P1c. Therefore, a small output current equal to the input current divided by M will be sourced at the current output 25. This is class A operation of the current mirror.

Finally, let us consider the situation where a large current, in particular a current larger than IB, is flowing into the current mirror input at 24. In this case, practically all of the input current will flow through transistors P2b and N1a, and the current through transistor P1b will approach zero. The current through transistor N1b will be approximately equal to the input current divided by M, and the current through transistor P1c will be approximately zero. Therefore, an output current equal to the input current divided by M will be sourced at the current mirror output 25. This is class B operation of the current mirror. An equivalent situation occurs when a large input current is flowing out of the current mirror input at 24, but in this case it will be transistors P1b and P1c which draw current and transistors N1a and N1b which draw approximately zero current.

REFERENCE NUMERALS

1—transducer element
2—amplifier circuit
3—die
4—diaphragm
5—back plate
6—input terminal
7—output terminal
8—preamplifier
9—input node
10—output node
11—transconductance amplifier
12—first input
13—second input
14—output
15—reference voltage source
16—capacitive attenuator
17—first capacitance
18—diode
19—diode
20—second capacitance
21—reference terminal
22—node
23—current mirror circuit
24—input port
25—output port
26—first node
27—second node
28—third node
29—current generator
P1a, P1b, P2a, P2b, P2c—PMOS transistor
N1a, N1b—NMOS transistor
G—gate
A—first port
B—second port

The invention claimed is:

1. An amplifier circuit for a capacitive transducer, comprising:
   a preamplifier adapted to receive a transducer signal through an input node and to provide an amplified signal at an output node; and
   a transconductance amplifier comprising a first input and an output,
   wherein the first input of the transconductance amplifier is connected to the output node, and the output of the transconductance amplifier is connected to the input node,
   wherein a capacitive attenuator circuit is connected between the output of the transconductance amplifier and the input node of the preamplifier,
   wherein the transconductance amplifier further comprises a second input connected to a reference voltage source, and
   wherein the transconductance amplifier is configured to provide a signal at the output that corresponds to the difference between the signals applied to its first and its second input.

2. The amplifier circuit according to claim 1, wherein the transconductance amplifier is a class AB amplifier.

3. The amplifier circuit according to claim 1, wherein a current mirror circuit is connected in series between the output of the transconductance amplifier and the input node of the preamplifier.

4. The amplifier circuit according to claim 3, wherein the current mirror circuit is adapted to downscale an output current provided by the output of the transconductance amplifier.

5. The amplifier circuit according to claim 1, wherein the capacitive attenuator circuit comprises a first capacitance connected in series between the output of the transconductance amplifier and the input node of the preamplifier and a pair of anti-parallel diodes connected in parallel to the first capacitance.

6. The amplifier circuit according to claim 5, wherein the AC impedance of the anti-parallel diodes is higher than the AC impedance of the first capacitance.

7. The amplifier circuit according to claim 5, wherein the capacitive attenuator circuit comprises a second capacitance connected in series between a reference terminal and a node arranged in a path connecting the output of the transconductance amplifier and the first capacitance.

8. The amplifier circuit according to claim 7, wherein the second capacitance has a larger capacitance than the first capacitance.

* * * * *